(12) United States Patent
Shimodaira et al.

(10) Patent No.: US 8,440,017 B2
(45) Date of Patent: May 14, 2013

(54) METHOD FOR GROWING GROUP 13 NITRIDE CRYSTAL AND GROUP 13 NITRIDE CRYSTAL

(75) Inventors: Takanao Shimodaira, Nagoya (JP); Takayuki Hirao, Nagoya (JP); Katsuhiro Imai, Nagoya (JP)

(73) Assignee: NGK Insulators, Ltd., Nagoya (JP)

( * ) Notice: Subject to any disclaimer, the term of this patent is extended or adjusted under 35 U.S.C. 154(b) by 60 days.

(21) Appl. No.: 13/208,944

(22) Filed: Aug. 12, 2011

(65) Prior Publication Data

US 2012/0012984 A1   Jan. 19, 2012

Related U.S. Application Data

(63) Continuation of application No. PCT/JP2009/071605, filed on Dec. 25, 2009.

(30) Foreign Application Priority Data

Feb. 16, 2009   (JP) ................................. 2009-032779

(51) Int. Cl.
  *C30B 19/00*   (2006.01)
(52) U.S. Cl.
  USPC .................. 117/64; 117/71; 117/74; 117/75; 117/209; 117/219; 117/934; 257/615; 257/E29.089; 257/E21.465; 257/E21.469; 438/222; 438/226; 438/492; 438/493; 438/497
(58) Field of Classification Search .................. None
  See application file for complete search history.

(56) References Cited

U.S. PATENT DOCUMENTS

2006/0169197 A1   8/2006   Sasaki et al.
2009/0155580 A1   6/2009   Shibata et al.

FOREIGN PATENT DOCUMENTS

| JP | 2007-137735 A1 | 6/2007 |
| JP | 2007-277055 A1 | 10/2007 |
| WO | 2004/083498 A1 | 9/2004 |

OTHER PUBLICATIONS

Liu et al. ("Effects of cycle patterns of accelerated crucible rotation technique (ACRT) on the flows, interface, and segregation in vertical Bridgman crystal growth", International Journal of Heat and Mass Transfer, 50, pp. 5031-5040, 2007).*
Yusuke Mori et al., "*Recent Development and Future Prospect of GaN Bulk Crystal Grown by Na Flux LPE Method*," Toyoda Gosei Technical Review, 2008, vol. 50, No. 1, pp. 2-7.
Fumio Kawamura et al., "*Growth of a Large GaN Single Crystal Using the Liquid Phase Epitaxy (LPE) Technique*," Japan Journal of Applied Physics, Jan. 15, 2003, vol. 42, No. 1 A/B, p. L-4 to L-6.

* cited by examiner

*Primary Examiner* — Julio J Maldonado
*Assistant Examiner* — Yasser Abdelaziez
(74) *Attorney, Agent, or Firm* — Burr & Brown

(57) ABSTRACT

To grow a gallium nitride crystal, a seed-crystal substrate is first immersed in a melt mixture containing gallium and sodium. Then, a gallium nitride crystal is grown on the seed-crystal substrate under heating the melt mixture in a pressurized atmosphere containing nitrogen gas and not containing oxygen. At this time, the gallium nitride crystal is grown on the seed-crystal substrate under a first stirring condition of stirring the melt mixture, the first stirring condition being set for providing a rough growth surface, and the gallium nitride crystal is subsequently grown on the seed-crystal substrate under a second stirring condition of stirring the melt mixture, the second stirring condition being set for providing a smooth growth surface.

6 Claims, 8 Drawing Sheets

(a)

(b)

(c)

(a) GROWTH UNDER FIRST STIRRING CONDITION (b) PLANARIZATION OF SURFACE (c) CLEANING TO REMOVE FOREIGN MATTER (d) GROWTH UNDER SECOND STIRRING CONDITION (a) Transmitted-light Microscopic Image  (b) Differential Interference Image  (c) Fluorescence Microscopic Image LPE Second Layer
LPE First Layer

METHOD FOR GROWING GROUP 13 NITRIDE CRYSTAL AND GROUP 13 NITRIDE CRYSTAL

TECHNICAL FIELD

The present invention relates to a method for growing a group 13 nitride crystal and a group 13 nitride crystal.

BACKGROUND ART

In recent years, production of semiconductor devices such as blue LEDs, white LEDs, and violet semiconductor lasers by using group 3B nitrides such as gallium nitride and application of such semiconductor devices to various electronic apparatuses have been actively studied. Existing gallium nitride semiconductor devices are mainly produced by vapor-phase methods: specifically, by heteroepitaxial growth of a gallium nitride thin film on a sapphire substrate or a silicon carbide substrate by a metal-organic vapor phase epitaxy method (MOVPE) or the like. In this case, since such a substrate and the gallium nitride thin film are considerably different from each other in terms of thermal expansion coefficient and lattice constant, dislocations (one type of lattice defects in crystals) are generated at a high density in the gallium nitride. Accordingly, it is difficult to provide gallium nitride of high quality having a low dislocation density by vapor-phase methods. Other than vapor-phase methods, liquid-phase methods have also been developed. As an example of liquid-phase methods, a high-temperature high-pressure synthesis method is known. In this method, nitrogen gas is made to be dissolved in molten gallium metal at a high temperature and at a high pressure to thereby directly crystallize gallium nitride. This method provides crystals of high quality; however, the reaction requires a very high temperature such as 1500° C. and a very high pressure such as 1 GPa and hence the method has a problem in practicality. A flux method is one of liquid-phase methods and, in the case of gallium nitride, allows a decrease in the temperature required for gallium nitride crystal growth to about 800° C. and a decrease in the pressure required for gallium nitride crystal growth to several megapascals by using sodium metal as a flux. Specifically, nitrogen gas dissolves in a melt mixture of sodium metal and gallium metal and the melt mixture is supersaturated with gallium nitride and a crystal of gallium nitride grows. Compared with vapor-phase methods, dislocations are less likely to be generated in such a liquid-phase method and hence gallium nitride of high quality having a low dislocation density can be obtained.

Studies on such flux methods have also been actively performed. For example, Patent Literature 1 proposes a crystal growth method for providing a gallium nitride crystal in which threading defects (defects constituted by dislocations extending through the crystal in the growth direction) are reduced. Specifically, in flux methods, gallium nitride crystals are grown on seed-crystal substrates. Seed crystals are generally generated by vapor-phase methods and hence have a high dislocation density. Accordingly, in flux methods, gallium nitride affected by defects constituted by such dislocations is grown. Such gallium nitride crystals have threading defects extending therethrough in the growth direction. When such gallium nitride crystals are applied to semiconductor devices, threading defects cause a leakage current, which is not preferable. Thus, in Patent Literature 1, a gallium nitride crystal is grown on a seed-crystal substrate under conditions such that oblique facets are formed; and the gallium nitride crystal is subsequently grown under conditions such that the crystal has a flat surface and grows in the c-axis direction. As for the latter conditions, the concentration of Li in the melt mixture is controlled to be in the range of 0.5 to 0.8 mol %. As a result, a gallium nitride crystal having a small number of threading defects is obtained.

CITATION LIST

Patent Literature

Patent Literature 1: JP 2007-137735 A

DISCLOSURE OF INVENTION

However, it is difficult to apply gallium nitride crystals containing lithium as in PTL 1 to semiconductor devices because lithium diffuses during fabrication or use of the devices to cause degradation of characteristics. Accordingly, there has been a demand for a gallium nitride crystal that is produced without adding lithium to a melt mixture and has small numbers of threading defects, grain boundaries, and inclusions. The inclusions are solidified matter that is derived from a melt mixture (melt of gallium metal and sodium metal) incorporated into a gallium nitride crystal.

A main object of the present invention is to provide a group 13 nitride crystal that is produced without using lithium and has small numbers of threading defects, grain boundaries, and inclusions.

The inventors of the present invention have newly found that, in the growth of a gallium nitride crystal on a seed-crystal substrate immersed in a melt mixture of gallium and sodium under heating in a pressurized atmosphere that contains nitrogen gas but does not contain oxygen gas, by adjusting stirring conditions of the melt mixture, whether the surface of the grown crystal is smooth or rough can be controlled. Thus, the inventors have accomplished the present invention.

Specifically, it has been found that, when a group 13 nitride crystal is continuously grown under a condition of intense stirring, a gallium nitride crystal having a small number of threading defects, but having a rough growth surface (surface of grown crystal) and a section in which grain boundaries extend obliquely is obtained (refer to FIG. 1(a)). In addition, entry of foreign matter (inclusions) in several grain boundaries is observed. The reason why the number of threading defects is small is not clear; however, the reason is probably that, when a crystal having a rough surface is grown, the growth proceeds not only in the c face but also in the directions of the sides of projections and, as a result, regions grown in the side directions hamper defect threads extending from dislocation defects of the seed-crystal substrate to thereby prevent the defects from reaching the surface. In contrast, it has been found that, when a group 13 nitride crystal is continuously grown under a condition of mild stirring, a gallium nitride crystal having a large number of threading defects due to dislocation defects of the seed-crystal substrate, but having a smooth growth surface (surface) and small numbers of grain boundaries and inclusions is obtained (refer to FIG. 1(b)).

The relationship between the content of inclusions and the density of threading defects in a crystal was represented in a graph and, as a result, the correlation illustrated in FIG. 2 was obtained. The content of inclusions is the area fraction of a black portion of a binarized image obtained by binarizing a photograph of a polished surface of a gallium nitride crystal substrate. The density of threading defects was calculated from the density of etch pits formed upon acid etching of the polished gallium nitride crystal substrate. FIG. 2 shows that it is difficult to produce crystals having a sufficiently low content of inclusions and a sufficiently low density of threading defects.

A gallium nitride crystal was grown by a flux method on the basis of such results. When the gallium nitride crystal was grown in a melt mixture under intense stirring, a crystal layer having large numbers of grain boundaries and inclusions, but having a small number of dislocation defects was obtained. A gallium nitride crystal was then further grown on the crystal layer in the melt mixture under mild stirring. The resultant crystal layer had a small number of threading defects due to a small number of dislocation defects in the underlying crystal layer, and had small numbers of grain boundaries and inclusions (refer to FIG. 1(c)). Such new findings have been found and, as a result, the present invention has been accomplished.

The term "smooth" refers to a case where, in a region of a crystal surface except for the circumferential region that extends 5 mm it from the rim, macro steps and steps formed by three-dimensional growth or the like are not observed; or, even when macro steps, three-dimensional growth, or the like are observed, the gap thereof is 10 mm or more or the distance ($R_{pv}$) between the highest position and the lowest position in the crystal surface is 0.1 mm or less. Unless such a condition is satisfied, the crystal surface is "rough".

The term "intense stirring" refers to a stirring operation of rotating a container at a high speed or changing a stirring speed or a stirring direction at short intervals to thereby increase the flow rate of a melt mixture in the container. The term "mild stirring" refers to a stirring operation of rotating a container at a low speed or changing a stirring speed or a stirring direction at long intervals to thereby provide slow convection in a melt mixture in the container.

A method for growing a group 13 nitride crystal according to the present invention includes growing a group 13 nitride crystal on a seed-crystal substrate under heating in a pressurized atmosphere that contains nitrogen gas but does not contain oxygen gas while the seed-crystal substrate is immersed in a melt mixture containing a group 3B metal and a flux, wherein the group 13 nitride crystal is grown under a first stirring condition of stirring the melt mixture, the first stirring condition being set for providing a rough growth surface; and the group 13 nitride crystal is subsequently grown under a second stirring condition of stirring the melt mixture, the second stirring condition being set for providing a smooth growth surface.

In this method for growing a group 13 nitride crystal, by growing a group 13 nitride crystal under the first stirring condition, the first crystal layer that has large numbers of grain boundaries and inclusions but has a small number of dislocation defects is generated on a seed-crystal substrate; and, by growing the group 13 nitride crystal under the second stirring condition, the second crystal layer that has small numbers of threading defects, grain boundaries, and inclusions is generated on the first crystal layer. Accordingly, a group 13 nitride crystal substrate in which the first crystal layer and the second crystal layer are stacked in this order on the seed-crystal substrate is provided. Thus, a group 13 nitride crystal having small numbers of threading defects, grain boundaries, and inclusions can be provided by only changing stirring conditions without using lithium.

Examples of the group 3B nitride include boron nitride (BN), aluminum nitride (AlN), gallium nitride (GaN), indium nitride (InN), and thallium nitride (TlN). Of these, gallium nitride is preferred. The seed-crystal substrate may be, for example, a sapphire substrate, a silicon carbide substrate, or a silicon substrate on a surface of which a thin film of the group 3B nitride is formed; or a substrate of the group 3B nitride.

In a method for growing a group 13 nitride crystal according to the present invention, the second stirring condition may be milder than the first stirring condition. For example, the first stirring condition may be a condition in which a stirring direction is reversed at intervals of a first predetermined time, and the second stirring condition may be a condition in which a stirring direction is reversed at intervals of a second predetermined time that is longer than the first predetermined time; or the first stirring condition may be a condition in which rotation is performed in a single direction at a first rotation speed, and the second stirring condition may be a condition in which rotation is performed in a single direction at a second rotation speed that is lower than the first rotation speed. Note that the first and second stirring conditions are not limited to these examples. The first stirring condition may be any condition under which a rough growth surface is provided. The second stirring condition may be any condition under which a smooth growth surface is provided.

In a method for growing a group 13 nitride crystal according to the present invention, a cycle defined as an operation of growing the group 13 nitride crystal under the first stirring condition and subsequently growing the group nitride crystal under the second stirring condition, may be repeated twice or more. In this case, in the growth of a group 13 nitride crystal under the first stirring condition in the second and subsequent cycles, since the underlying layer is not a seed-crystal substrate but a crystal layer that is grown under the second stirring condition in the pervious cycle and has a small number of threading defects, the resultant crystal has less dislocation defects. Accordingly, subsequent crystal growth under the second stirring condition provides a group 13 nitride crystal having less threading defects.

A method for growing a group 13 nitride crystal according to the present invention may be performed as follows: the group 13 nitride crystal is grown under the first stirring condition; the seed-crystal substrate that is overlain by the grown crystal is subsequently taken out from the pressurized atmosphere into the air; a surface of the crystal is planarized so as to have a surface roughness Ra of 1.5 μm or less; the planarized crystal substrate is cleaned to remove oxide of the group 3B metal and/or oxide of the flux; and the seed-crystal substrate is subsequently brought back into the pressurized atmosphere and the group 13 nitride crystal is grown under the second stirring condition. When a group 13 nitride crystal grown under the first stirring condition has, in the growth surface, a rough region having a large height difference, even when the group 13 nitride crystal is subsequently grown under the second stirring condition, there are cases where the resultant growth surface has non-smooth regions and the crystal quality is degraded. However, in the above-described case, the crystal is grown under the first stirring condition and the growth surface is then planarized and oxide is removed. Accordingly, in the crystal growth under the second stirring condition, the entire surface is grown as a smooth surface with high reproducibility and the percentage of defectives decreases.

An example of specific procedures of a method for growing a group 13 nitride crystal according to the present invention, the method including such surface planarization and cleaning of oxide, is illustrated in FIG. 3. A crystal is grown under the first stirring condition (refer to FIG. 3(a)). At this time, some of grain boundaries contain foreign matter (inclusions). The crystal is then taken out into the air and the surface of the crystal is planarized (refer to FIG. 3(b)). Since the crystal is taken out into the air, the foreign matter (inclusions) is oxidized to be turned into oxide of the group 3B metal or oxide of the flux. The planarization may be performed with a publicly known polishing apparatus such as a lapping apparatus or a chemical-mechanical polishing (CMP) apparatus. The planarized surface preferably has a surface roughness Ra of 1.5 μm or less, more preferably 0.6 μm or less. When the surface roughness Ra is more than 1.5 μm, the number of dislocations may increase in the crystal growth under the second stirring condition. In addition to the planarization, a surface oxidized layer and a work affected layer may be removed by dry etching. The planarized surface is then cleaned to remove oxide of the group 3B metal and/or oxide of the flux (refer to FIG. 3(c)). This removal of oxide is performed by, for example, a heat treatment or cleaning with an alkaline solution or an acidic solution. In addition to such removal of oxide, organic matter may be removed with an organic solvent such as acetone or alcohol; remaining carbon, organic matter, and abrasive grain in planarization may be removed with an oxygen plasma asher; or a surface oxidized layer and a work affected layer may be removed by dry etching. After that, the crystal is brought back into the pressurized atmosphere that contains nitrogen gas but does not contain oxygen gas and the crystal is grown under the second stirring condition (refer to FIG. 3(d)).

A group 13 nitride crystal according to the present invention is a group 13 nitride crystal in which a content of an alkali metal is not higher than a lower limit of detection by SIMS, the group 13 nitride crystal including:

a first crystal layer that includes, in a cross section of the first crystal layer, grain boundaries present in a direction that intersects with a direction in which defects in a seed-crystal substrate extend; and a second crystal layer that overlies the first crystal layer, that includes, in a cross section of the second crystal layer, none of the grain boundaries or less of the grain boundaries than the first crystal layer, and that includes a region having an etch pit density (EPD) of $10^4/cm^2$ or less.

Such a group 13 nitride crystal can be provided by the above-described method for growing a group 13 nitride crystal. Lower limits of detection by SIMS vary to an extent depending on measurement apparatuses and measurement conditions. For lithium, the lower limit of detection is about $10^{15}$ atoms/$cm^3$. For sodium, the lower limit of detection is about $10^{15}$ atoms/$cm^3$. By producing a group 3B nitride wafer from the second crystal layer (refer to FIG. 1(c)), a wafer of high quality having a small number of defects and scarcely having grain boundaries, inclusions, and alkali metals such as lithium can be obtained. Such a wafer can be applied to, for example, white LEDs that have high color-rendering properties and are expected to replace fluorescent lamps, violet lasers for high-speed high-density optical storages, and power devices used for inverters for hybrid vehicles.

BEST MODES FOR CARRYING OUT THE INVENTION

Figure 4:
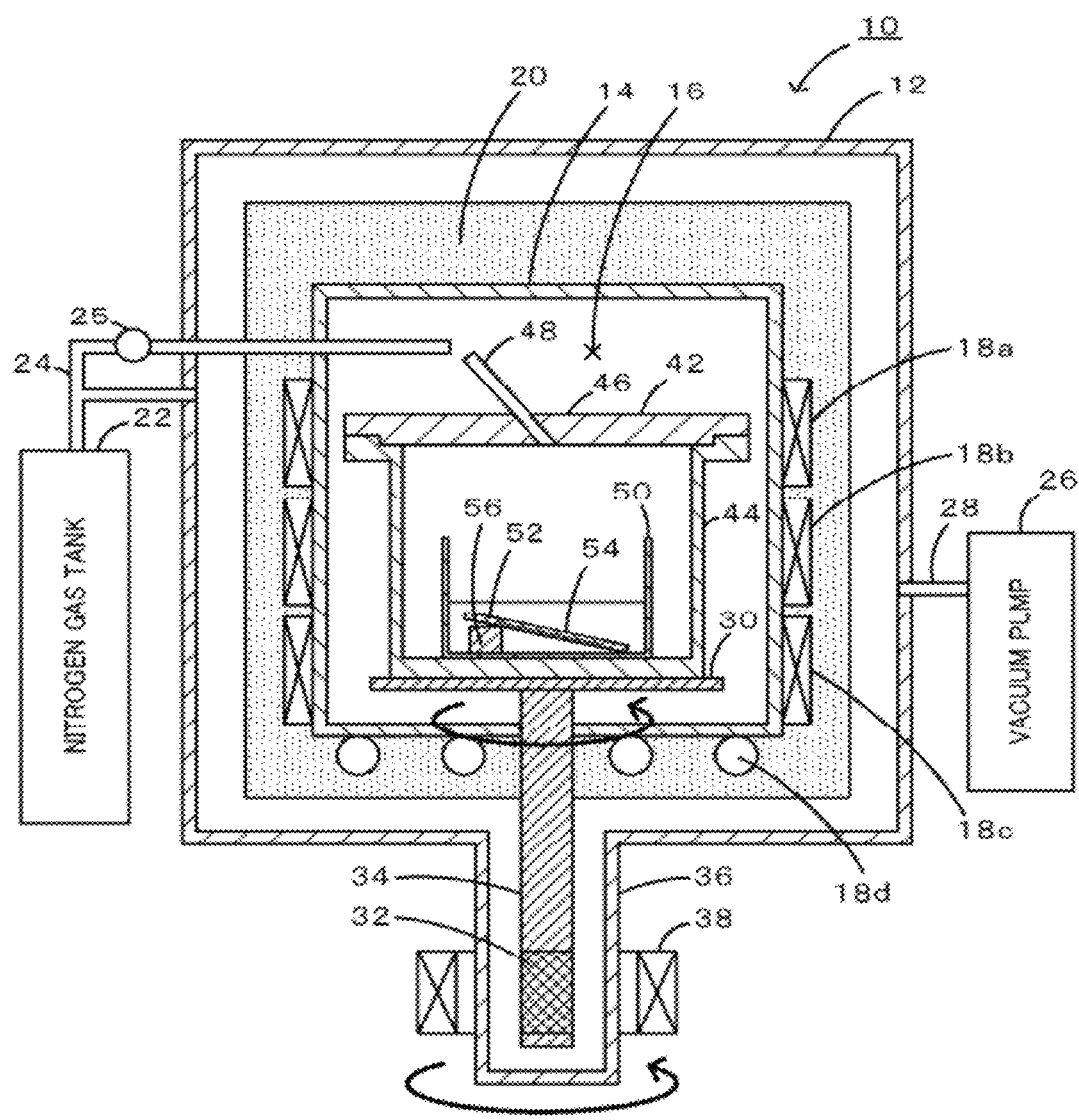
FIG. 4 is an explanatory view (sectional view) illustrating the entire configuration of a crystal substrate production apparatus 10.

Hereinafter, a preferred apparatus for producing a group 13 nitride crystal substrate according to the present invention will be described with FIG. 4. FIG. 4 is an explanatory view (sectional view) illustrating the entire configuration of a crystal substrate production apparatus 10.

As illustrated in FIG. 4, a crystal substrate production apparatus 10 includes a pressure-resistant container 12 that can be evacuated and to which pressurized nitrogen gas can be fed; a turntable 30 rotatable within the pressure-resistant container 12; and an outer container 42 placed on the turntable 30.

The pressure-resistant container 12 has the shape of a cylinder with top and bottom surfaces having the shape of a disc; and contains a heating space 16 surrounded by a heater cover 14. The internal temperature of the heating space 16 can be adjusted with an upper heater 18a, a middle heater 18b, and a lower heater 18c that are arranged in the vertical direction along the lateral surface of the heater cover 14, and a bottom heater 18d disposed on the bottom surface of the heater cover 14. The heating space 16 has thermal insulating properties enhanced with a thermal insulating heater member 20 surrounding the heater cover 14. A nitrogen-gas feed pipe 24 from a nitrogen-gas tank 22 and an evacuation pipe 28 from a vacuum pump 26 are connected to the pressure-resistant container 12. The nitrogen-gas feed pipe 24 passes through the pressure-resistant container 12, the thermal insulating heater member 20, and the heater cover 14 into and so as to be in communication with the heating space 16. The nitrogen-gas feed pipe 24 branches off at an intermediate point therealong and is connected to and is in communication with a gap between the pressure-resistant container 12 and the thermal insulating heater member 20. The heater cover 14 is not completely airtight. To prevent a large pressure difference between the inside and outside of the heater cover 14, nitrogen gas is fed to the inside and outside of the heater cover 14. The branched pipe in the nitrogen-gas feed pipe 24 and in communication with the heating space 16 is equipped with a mass-flow controller 25 with which the flow rate can be controlled. The evacuation pipe 28 passes through the pressure-resistant container 12 into and so as to be in communication with a gap between the pressure-resistant container 12 and the thermal insulating heater member 20. When a vacuum is generated outside the heater cover 14, a vacuum is also generated in the heating space 16, which is in communication with the outside of the heater cover 14 through the nitrogen-gas feed pipe 24.

The turntable 30 is disc-shaped and disposed at a lower position within the heating space 16. A rotational shaft 34 including an internal magnet 32 is secured to the bottom surface of the turntable 30. The rotational shaft 34 extends through the heater cover 14 and the thermal insulating heater member 20 and is inserted into a cylindrical casing 36 integrated with the bottom surface of the pressure-resistant container 12. A cylindrical external magnet 38 is disposed around the casing 36 so as to be rotatable with a motor (not shown). The external magnet 38 and the internal magnet 32 in the rotational shaft 34 face each other with the casing 36 therebetween. Accordingly, as the external magnet 38 rotates, the rotational shaft 34 including the internal magnet 32 rotates and, as a result, the turntable 30 rotates. In addition, as the external magnet 38 moves upward or downward, the rotational shaft 34 including the internal magnet 32 moves upward or downward and, as a result, the turntable 30 moves upward or downward.

The outer container 42 has a metal outer-container body 44 having a cylindrical shape with a bottom and a metal outer-container lid 46 configured to seal an upper opening of the outer-container body 44. The outer-container lid 46 is equipped with a nitrogen introduction pipe 48 extending obliquely upward from the center of the bottom surface of the outer-container lid 46. The nitrogen introduction pipe 48 is designed such that, even when the outer container 42 rotates with the rotation of the turntable 30 and the nitrogen introduction pipe 48 reaches a position closest to the nitrogen-gas feed pipe 24, the nitrogen introduction pipe 48 does not collide with the nitrogen-gas feed pipe 24. Specifically, the distance between the nitrogen-gas feed pipe 24 and the nitrogen introduction pipe 48 that is at the position closest to the nitrogen-gas feed pipe 24 is designed to be several millimeters to several tens centimeters. A cylindrical growth vessel 50 made of alumina with a bottom is disposed within the outer-container body 44. A seed-crystal-substrate tray 52 that is disc-shaped and made of alumina is placed in the growth vessel 50. The seed-crystal-substrate tray 52 has, in its central portion, a recess into which a disc-shaped seed-crystal substrate 54 is fitted. An end of the seed-crystal-substrate tray 52 is placed on a tray support 56 and the other end of the seed-crystal-substrate tray 52 is in contact with the bottom surface of the growth vessel 50. The seed-crystal substrate 54 may be a sapphire substrate on a surface of which a thin film of the group 3B nitride is formed or a thin plate of the group 3B nitride. The growth vessel 50 contains a group 3B metal and a flux. The flux is preferably alkali metals, more preferably sodium metal and potassium metal, still more preferably sodium metal. The group 3B metal and the flux are heated to be turned into a melt mixture. In the present embodiment, the outer container 42 and the growth vessel 50 are disposed so as to be coaxial with the rotation central axis of the turntable 30. Accordingly, the melt mixture in the growth vessel 50 horizontally rotates during the rotation and does not considerably move in the vertical direction.

Figure 1:
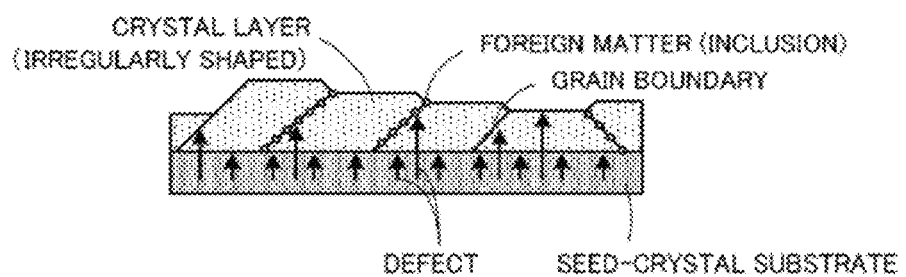
FIG. 1 illustrates schematic sectional views of gallium nitride crystals: (a) illustrates a crystal obtained under intense stirring of a melt mixture; (b) illustrates a crystal obtained under mild stirring of a melt mixture; and (c) illustrates a crystal obtained under intense stirring and subsequent mild stirring of a melt mixture.
Figure 1:
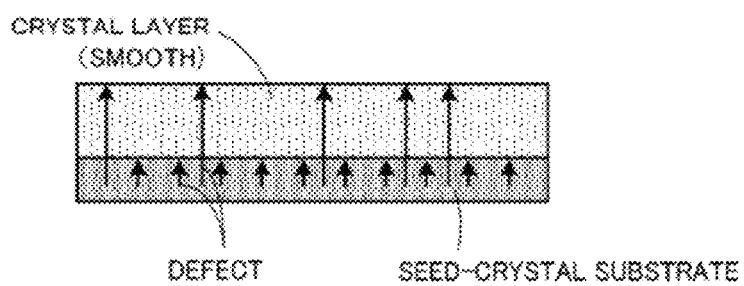
Figure 1:
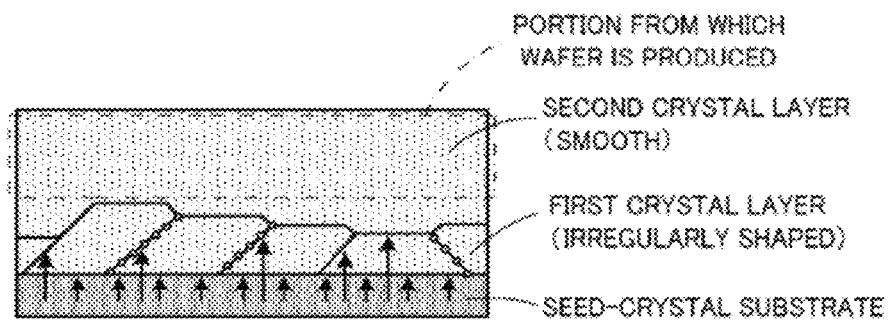

An example of using the crystal substrate production apparatus 10 having the above-described configuration according to the present embodiment will be described. The crystal substrate production apparatus 10 is used to produce a group 3B nitride by a flux method. Hereinafter, a case of producing a gallium nitride crystal substrate as a group 13 nitride crystal substrate will be described as an example. In this case, a GaN template (having an EPD of about $10^8/cm^2$) in which the seed crystal has been grown by a vapor-phase method is prepared as the seed-crystal substrate 54; gallium metal is prepared as the group 3B metal; and sodium metal is prepared as the flux. The seed-crystal substrate 54 is immersed in a melt mixture containing gallium metal and sodium metal in the growth vessel 50. While the turntable 30 is rotated under the first stirring condition set for providing a rough growth surface (surface of grown crystal), the heating space 16 is heated with the heaters 18a to 18d and pressurized nitrogen gas is fed to the melt mixture. Thus, a gallium nitride crystal is grown on the seed-crystal substrate 54 in the melt mixture. This state is held for the first holding time set in advance. After that, the stirring condition is changed to the second stirring condition set for providing a smooth growth surface and the gallium nitride crystal is grown. This state is held for the second holding time longer than the first holding time. The gallium nitride crystal substrate grown in the melt mixture in the growth vessel 50 can be collected by, after cooling, adding an organic solvent (for example, lower alcohol such as methanol or ethanol) to the vessel to dissolve unnecessary substances such as the flux in the organic solvent. As illustrated in FIG. 1(c), the thus-obtained gallium nitride crystal substrate has the first crystal layer grown so as to have a rough surface on the seed-crystal substrate 54 and the second crystal layer grown on the first crystal layer so as to have a smooth surface. The first crystal layer has large numbers of grain boundaries and inclusions but has a small number of dislocation defects. Since the first crystal layer has less dislocations than the seed-crystal substrate 54, the second crystal layer has a small number of threading defects, compared with cases where the second crystal layer is grown directly on the seed-crystal substrate 54 so as to have a smooth surface. In addition, the second crystal layer has small numbers of grain boundaries and inclusions. The second crystal layer has the content of inclusions of 0 to 10% (0 to 2% depending on growth conditions). The content of inclusions is the area fraction of a black portion of a binarized image obtained by binarizing a photograph of the polished surface of the gallium nitride crystal substrate.

In the production of a gallium nitride crystal substrate as described above, the heating temperature is set below the boiling temperature of the melt mixture in pressurized nitrogen gas atmosphere. Specifically, the heating temperature is preferably set at 700 to 1000° C., more preferably at 800 to 900° C. To make the temperature of the heating space 16 be uniform, it is preferred that the upper heater 18a, the middle heater 18b, the lower heater 18c, and the bottom heater 18d be set so as to have ascending temperatures in this order; or that the upper heater 18a and the middle heater 18b be set at a temperature T1 while the lower heater 18c and the bottom heater 18d be set at a temperature T2 higher than the temperature T1. The pressure of the pressurized nitrogen gas is preferably set at 1 to 7 MPa, more preferably 2 to 6 MPa. To adjust the pressure of the pressurized nitrogen gas, the vacuum pump 26 is driven to make the internal pressure of the pressure-resistant container 12 be a high vacuum (for example, 1 Pa or less or 0.1 Pa or less) through the evacuation pipe 28; the evacuation pipe 28 is then closed with a valve (not shown); and nitrogen gas is fed to the inside and outside of the heater cover 14 through the nitrogen gas feed pipe 24 from the nitrogen-gas tank 22. While a gallium nitride crystal is grown, nitrogen gas is dissolved in the melt mixture and consumed by crystal growth, thus decreasing the pressure of the pressurized nitrogen gas. Accordingly, nitrogen gas continues to be fed to the heating space 16 with the mass flow controller 25 at a predetermined flow rate during crystal growth. At this time, the branched pipe in the nitrogen gas feed pipe 24 and in communication with the outside of the heater cover 14 is closed with a valve (not shown).

The stirring conditions in the growth of a gallium nitride crystal may be any conditions as long as the first stirring condition is set for providing a rough growth surface and the second stirring condition is set for providing a growth surface that is smoother than the growth surface provided by the crystal growth under the first stirring condition. The second stirring condition is preferably milder than the first stirring condition. Examples of stirring modes include a single-direction rotation, a rotation including reverse of the direction of rotation, and an intermittent rotation. Herein, the term "intermittent rotation" refers to an operation of alternately performing a single-direction rotation and a pause; an operation of repeating the sequence of a rotation in a single direction, a pause, a rotation in the reverse direction, and a pause; or an operation of alternately performing a high-speed rotation and a low-speed rotation. The stirring modes in the first and second stirring conditions may be the same as or different from each other. When the same stirring mode is employed in the first and second stirring conditions, the first stirring condition may be a condition in which the stirring direction is reversed at intervals of the first predetermined time; and the second stirring condition may be a condition in which the stirring direction is reversed at intervals of the second predetermined time that is longer than the first predetermined time. Alternatively, the first stirring condition may be a condition in which rotation is performed in a single direction at the first rotation speed; and the second stirring condition may be a condition in which rotation is performed in a single direction at the second rotation speed that is lower than the first rotation speed. Alternatively, the first stirring condition may be a condition in which rotation is performed in a single direction at the first rotation speed, the rotation is then terminated for the first pause, and the rotation is then performed again at the first rotation speed; and the second stirring condition may be a condition in which rotation is performed in a single direction at the second rotation speed that is lower than the first rotation speed, the rotation is then terminated for the second pause, and the rotation is then performed again at the second rotation speed. When different stirring modes are employed in the first and second stirring conditions, the first stirring condition may be a condition in which the stirring direction is reversed on a regular basis; and the second stirring condition may be a condition in which stirring is performed in a single direction. Alternatively, the first stirring condition may be a condition in which stirring is performed in a single direction; and the second stirring condition may be a condition in which the stirring direction is reversed on a regular basis. A cycle constituted by a step of growing a crystal with stirring under the first stirring condition and a step of growing the crystal with stirring under the second stirring condition may be repeated twice or more. Note that the first and second stirring conditions are not limited to the examples described herein. The first stirring condition may be any condition set for providing a rough growth surface. The second stirring condition may be any condition set for providing a growth surface that is smoother than the growth surface provided by the crystal growth under the first stirring condition.

The second stirring condition is set for providing a smooth growth surface. The second stirring condition is preferably set such that the crystal growth rate of gallium nitride is 5 to 25 μm/h, more preferably 10 to 25 μm/h. When the crystal growth rate is less than 5 μm/h, crystal growth time becomes excessively long and it becomes difficult to practically produce the crystal. When the crystal growth rate is more than 25 μm/h, the content of inclusions tends to increase, which is not preferable. The growth vessel 50 under the second stirring condition is preferably rotated by rotation in a single direction without being reversed; by repeating a reverse operation constituted by rotation in a direction for a minute or more and then rotation in the reverse direction for a minute or more; or by repeating an intermittent operation constituted by rotation in a direction for 5 seconds or more, subsequently a pause for a short period (for example, 0.1 to 2 seconds), and then rotation in the same direction for 5 seconds or more. When the reverse operation is repeated at intervals shorter than a minute or the intermittent operation is repeated at intervals shorter than 5 seconds, the crystal growth rate becomes too high and the content of inclusions increases, which is not preferable. The growth time of a gallium nitride crystal under the second stirring condition may be appropriately set in accordance with heating temperature or the pressure of pressurized nitrogen gas, for example, in the range of several hours to several hundred hours. The first stirring condition is preferably set so as to be more severe than the second stirring condition. For example, the first stirring condition is preferably set such that the growth rate of a gallium nitride crystal is more than 25 μm/h. The growth vessel 50 under the first stirring condition is preferably rotated by repeating a reverse operation at short intervals or by repeating an intermittent operation including rotations each performed for a short duration, compared with the second stirring condition. The growth time of a gallium nitride crystal under the first stirring condition may be appropriately set in accordance with heating temperature or the pressure of pressurized nitrogen gas, for example, in the range of several hours to several tens of hours.

As has been described so far in detail, according to the present embodiment, growth of a group 13 nitride crystal under the first stirring condition results in generation of the first crystal layer having large numbers of grain boundaries and inclusions but a small number of dislocation defects, on a seed-crystal substrate; and subsequent growth of the group 13 nitride crystal under the second stirring condition results in generation of the second crystal layer having small numbers of threading defects, grain boundaries, and inclusions, on the first crystal layer. Accordingly, a group 13 nitride crystal substrate in which the first crystal layer and the second crystal layer are stacked in this order on the seed-crystal substrate 54 is provided. Thus, a group 13 nitride crystal having small numbers of threading defects, grain boundaries, and inclusions can be provided by only changing stirring conditions without using lithium.

In addition, since the seed-crystal-substrate tray 52 in the center of which the seed-crystal substrate 54 is fitted is used and an end of the seed-crystal-substrate tray 52 is placed on the tray support 56 such that the seed-crystal-substrate tray 52 is inclined in the growth vessel 50, crystal growth tends to sufficiently proceed on the entire surface of the seed-crystal substrate 54. Since a melt mixture tends to stagnate in the circumferential region on the bottom surface of the growth vessel 50, when a portion of the seed-crystal substrate 54 is positioned near the region, crystal growth in the portion is less likely to sufficiently proceed. However, in the present embodiment, since the seed-crystal-substrate tray 52 is used, the seed-crystal substrate 54 is not positioned near the circumferential region on the bottom surface of the growth vessel 50 and crystal growth tends to sufficiently proceed on the entire surface of the seed-crystal substrate 54.

In addition, since the nitrogen-gas feed pipe 24 is separated from the nitrogen introduction pipe 48, the feed pipe 24 and the pipe 48 do not hamper rotation of the outer container 42 together with the turntable 30.

In addition, since the upper, middle, and lower heaters 18a to 18c and the bottom heater 18d are disposed, the entirety of the heating space 16 including a portion near the bottom in which uniform temperature is less likely to be achieved can be uniformly maintained at a temperature.

In addition, since the rotational shaft 34 integrated with the internal magnet 32 is configured to rotate or move upward or downward in accordance with rotation or movement upward or downward of the external magnet 38 disposed around the casing 36, the outer container 42 can be rotated or moved upward or downward while the interior of the pressure-resistant container 12 is kept sealed.

EXAMPLES

Example 1

A gallium nitride crystal substrate was produced with the crystal substrate production apparatus 10 illustrated in FIG. 4. Hereinafter, the procedures will be described in detail.

The tray support 56 was placed in a marginal portion within the growth vessel 50 having an internal diameter of 70 mm within a glove box having an argon atmosphere. The seed-crystal-substrate tray 52 was placed so as to lean on the tray support 56, at an angle of 10° in the center of the bottom surface of the growth vessel 50. A GaN template having a diameter of 2 inches was placed as the seed-crystal substrate 54 in the center of the seed-crystal-substrate tray 52. Furthermore, 60 g of sodium metal and 40 g of gallium metal were added into the growth vessel 50. The growth vessel 50 was put into the outer-container body 44. The opening of the outer-container body 44 was closed with the outer-container lid 46 equipped with the nitrogen introduction pipe 48. The outer container 42 was placed on the turntable 30 that had been baked in vacuum. The pressure-resistant container 12 was sealed with a lid (not shown).

Figure 5:
FIG. 5 is an exterior photograph of a gallium nitride crystal obtained in Example 1.

The pressure-resistant container 12 was evacuated to 0.1 Pa or less by driving the vacuum pump 26. Subsequently, while the upper heater 18a, the middle heater 18b, the lower heater 18c, and the bottom heater 18d were respectively set at 855° C., 855° C., 880° C., and 880° C. to heat the heating space 16 to 870° C., nitrogen gas was introduced from the nitrogen-gas tank 22 to reach 4.5 MPa. With the temperature increase, the outer container 42 was simultaneously rotated about the central axis at 30 rpm while the rotation was reversed every 15 seconds. This state was held for 24 hours. After that, the reverse interval was changed to 5 minutes and this state was held for 130 hours. In this case, the first stirring condition was a condition in which rotation was performed at 30 rpm and the rotation was reversed every 15 seconds; and the second stirring condition was a condition in which rotation was performed at 30 rpm and the rotation was reversed every 5 minutes. Subsequently, the temperature was allowed to decrease naturally to room temperature. The lid of the pressure-resistant container 12 was then opened and the growth vessel 50 was taken out. Ethanol was added into the growth vessel 50 to dissolve sodium metal in ethanol. The gallium nitride crystal substrate grown was then collected. The gallium nitride crystal substrate had a diameter of 2 inches and a thickness of about 2 mm. The crystal growth rate was about 13 μm/h. Although the substrate substantially had a uniform thickness, shallow irregularities having a height difference of 30 μm or less were observed at positions close to a circumferential portion of the crystal surface. An exterior photograph of the crystal is illustrated in FIG. 5.

Figure 6:
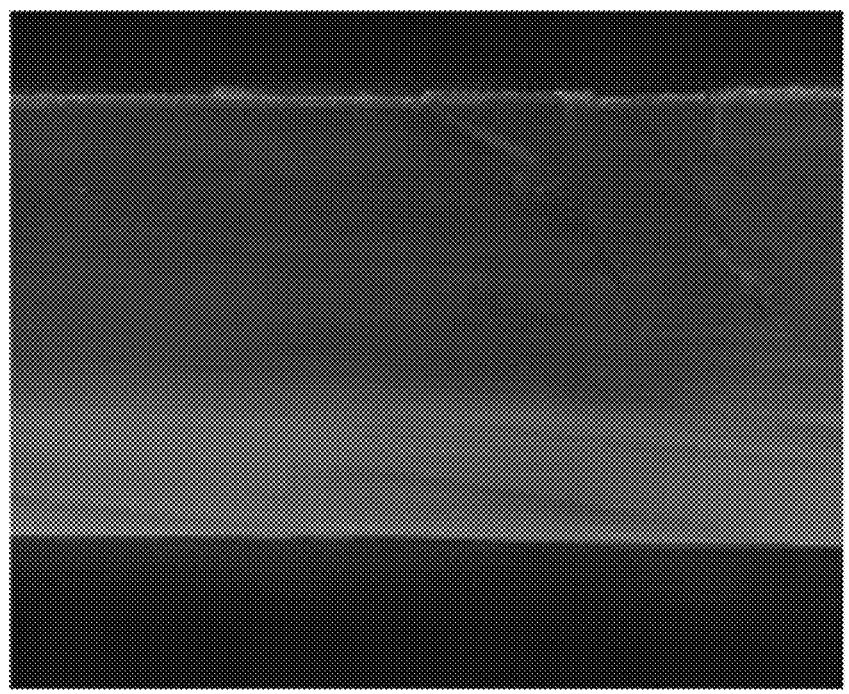
FIG. 6 is a photograph of a fluorescence microscopic image of a section of a gallium nitride crystal substrate obtained in Example 1.

A portion of the gallium nitride crystal substrate was cut off and a section of the substrate was observed with an optical microscope. The observation was performed under irradiation with ultraviolet rays and different growth histories were observed in a region corresponding to the former half of the crystal growth in which the reverse interval was 15 seconds and in a region corresponding to the latter half of the crystal growth in which the reverse interval was 5 minutes. A photograph of a fluorescence microscopic image of the section is illustrated in FIG. 6.

A portion (inclusion-free portion) of the gallium nitride crystal substrate was subjected to elemental analysis by SIMS. The contents of alkali metals such as Li, Na, and K were not higher than the lower limits of detection. The contents of alkaline-earth metals such as Mg and Ca were also not higher than the lower limits of detection. The contents of C and O were also not higher than the lower limits of detection. The analysis results, all in atoms/cm$^3$, are described in Table 1.

TABLE 1

| | SIMS Elemental Analysis | | |
| --- | --- | --- | --- |
| Element | Measured Value | Lower Limit Value | Result |
| H | 6.E+16 | 7.E+16 | Not Detected |
| Li | 7.E+14 | 6.E+14 | Not Detected |
| C | 2.E+16 | 3.E+16 | Not Detected |
| O | 4.E+16 | 3.E+16 | Not Detected |
| Na | 3.E+14 | 3.E+14 | Not Detected |
| Mg | 4.E+15 | 3.E+15 | Not Detected |
| Al | 8.E+16 | 9.E+16 | Not Detected |
| Si | 4.E+16 | 5.E+14 | Detected |
| Ca | 1.E+16 | 8.E+15 | Not Detected |
| In | 9.E+15 | 5.E+15 | Not Detected |
| K | 5.E+13 | 3.E+13 | Not Detected |

A portion of the gallium nitride crystal substrate, the portion being close to the front surface of the substrate, was polished such that the substrate had a thickness of 500 μm. A photograph of the gallium nitride crystal substrate was binarized. The area of inclusions (area of black portions in the binarized image) within a region of the seed-crystal substrate 54 except for the circumferential portion of the seed-crystal substrate 54, the region corresponding to 70% of the seed-crystal substrate 54, was determined. The area fraction of inclusions relative to the entirety of the 70% region, that is, the inclusion content was calculated. The inclusion content was found to be 0 to 10%.

The polished gallium nitride crystal substrate was etched by being immersed into an acidic solution (a mixed solution of sulfuric acid:phosphoric acid=1:3) at 250° C. for about 2 hours. After the etching, differential-interference-image observation was performed with an optical microscope. Etch pits derived from dislocations were counted and EPD was calculated. Almost the entire region except for the circumferential portion had an EPD on the order of $10^4/cm^2$ or less.

Example 2

A gallium nitride crystal was grown under the same conditions as in Example 1 except that the outer container 42 was held for 24 hours with a reverse interval of 15 seconds, then held for 6 hours with a reverse interval that was changed to 5 minutes, held for 6 hours with a reverse interval that was changed again to 15 seconds, and then held for 120 hours with a reverse interval that was changed again to 5 minutes. The resultant gallium nitride crystal had a diameter of 2 inches and a thickness of 2.3 mm. The crystal growth rate was about 15 μm/h. The crystal surface was smooth. The observation of a section was performed as in Example 1 and three changes in the growth history were observed during the crystal growth. The SIMS analysis was performed as in Example 1 and the contents of alkali metals were not higher than the lower limits of detection. The polishing and evaluation of inclusion content by image processing was performed as in Example 1 and the inclusion content was found to be 0 to 10%. The evaluation of EPD was performed as in Example 1 and it was found that almost the entire region had an EPD on the order of $10^4/cm^2$ or less and there were some portions having no dislocations.

Example 3

A gallium nitride crystal was grown under the same conditions as in Example 1 except that the outer container 42 was held for 24 hours with a reverse interval of 15 seconds and then held for 130 hours while being rotated at a fixed rotation speed of 30 rpm in a single direction. The resultant gallium nitride crystal had a diameter of 2 inches and a thickness of about 2 mm. The crystal growth rate was about 13 μm/h. Although most portions of the crystal surface were smooth, slight irregularities were observed in portions in the proximity of the circumferential portion. The observation of a section was performed as in Example 1 and a change in the growth history was observed at a position corresponding to the change of the rotation conditions. The polishing and evaluation of inclusion content by image processing was performed as in Example 1 and the inclusion content was found to be 0 to 10%. The evaluation of EPD was performed as in Example 1 and it was found that almost the entire region except for the circumferential portion had an EPD on the order of $10^4/cm^2$ or less.

Example 4

A gallium nitride crystal was grown under the same conditions as in Example 1 except that the outer container 42 was rotated by repeating, for 24 hours, the sequence of holding a rotation speed of 6 rpm for 10 seconds, then changing the rotation speed to 60 rpm without termination of the rotation and holding the rotation speed for 10 seconds, then changing the rotation speed back to 6 rpm and holding the rotation speed for 10 seconds, and then changing the rotation speed back to 60 rpm and holding the rotation speed for 10 seconds; and then holding rotation for 130 hours at a fixed rotation speed of 30 rpm in a single direction. The resultant gallium nitride crystal had a diameter of 2 inches and a thickness of about 1.8 mm. The crystal growth rate was about 12 μm/h. The crystal surface was substantially smooth. The observation of a section was performed as in Example 1 and a change in the growth history was observed at a position corresponding to the change of the rotation conditions. The polishing and evaluation of inclusion content by image processing was performed as in Example 1 and the inclusion content was found to be 0 to 10%. The evaluation of EPD was performed as in Example 1 and it was found that almost the entire region except for the circumferential portion had an EPD on the order of $10^4/cm^2$ or less.

Comparative Example 1

Figure 7:
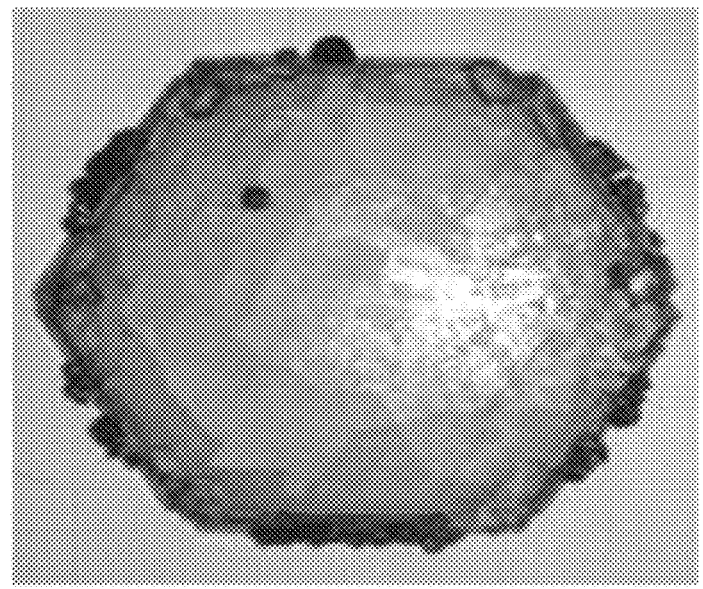
FIG. 7 is an exterior photograph of a gallium nitride crystal obtained in Comparative Example 1.
Figure 8:
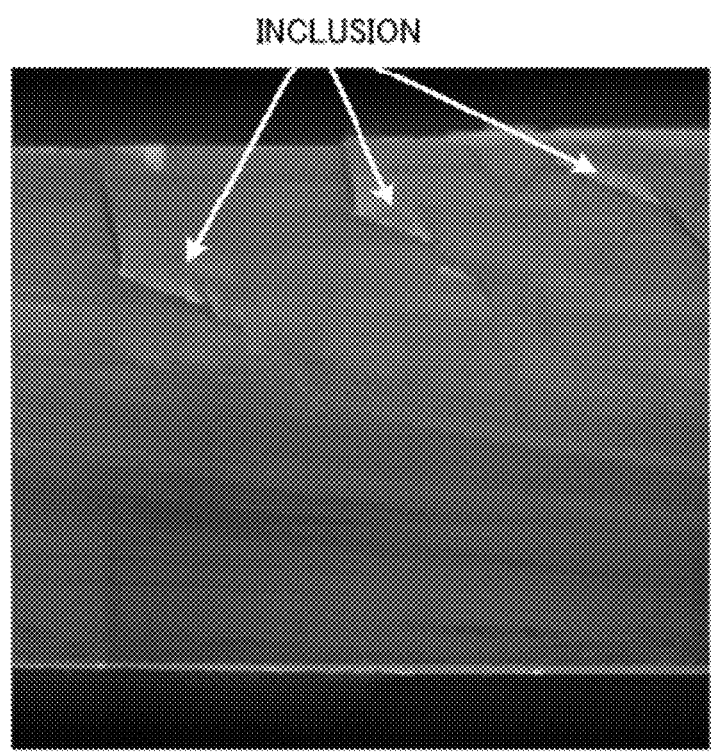
FIG. 8 is a photograph of a fluorescence microscopic image of a section of a gallium nitride crystal substrate obtained in Comparative Example 1.

A gallium nitride crystal was grown under the same conditions as in Example 1 except that the reverse interval of the outer container 42 was fixed at 15 seconds and was not changed throughout the growth. The resultant gallium nitride crystal had a diameter of 2 inches and a thickness of about 4 mm. The crystal growth rate was about 26 μm/h. Step-shaped irregularities were observed in a wide area of the crystal surface. An exterior photograph of the crystal is illustrated in FIG. 7. The observation of a section was performed as in Example 1 and no clear change in the growth history during the crystal growth was observed. Generation of inclusions was observed during the growth. A photograph of a fluorescence microscopic image of the section is illustrated in FIG. 8. The polishing and evaluation of inclusion content by image processing was performed as in Example 1 and the inclusion content was found to be 6 to 30%. The evaluation of EPD was performed as in Example 1 and it was found that EPD was on the order of $10^4/cm^2$ or less in a portion corresponding about 90% of the region.

Comparative Example 2

Figure 9:
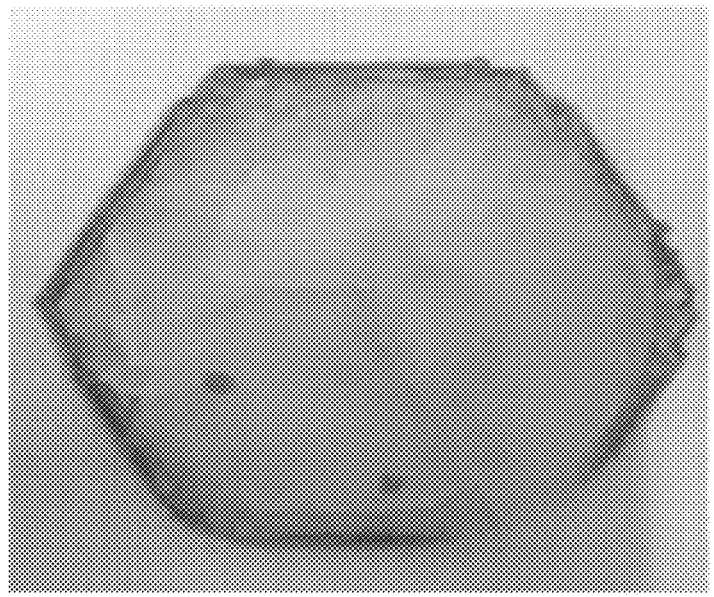
FIG. 9 is an exterior photograph of a gallium nitride crystal obtained in Comparative Example 2.

A gallium nitride crystal was grown under the same conditions as in Example 1 except that the reverse interval of the outer container 42 was fixed at 5 minutes and was not changed throughout the growth. The resultant gallium nitride crystal had a diameter of 2 inches and a thickness of about 1.8 mm. The crystal growth rate was about 12 μm/h. The entire crystal surface was smooth. An exterior photograph of the crystal is illustrated in FIG. 9. The observation of a section was performed as in Example 1 and no clear change in the growth history during the crystal growth was observed. The polishing and evaluation of inclusion content by image processing was performed as in Example 1 and the inclusion content was found to be 0 to 1%. The evaluation of EPD was performed as in Example 1 and it was found that EPD was on the order of $10^5$ to $10^6/cm^2$ in a portion corresponding about 90% of the region.

Example 5

Figure 2:
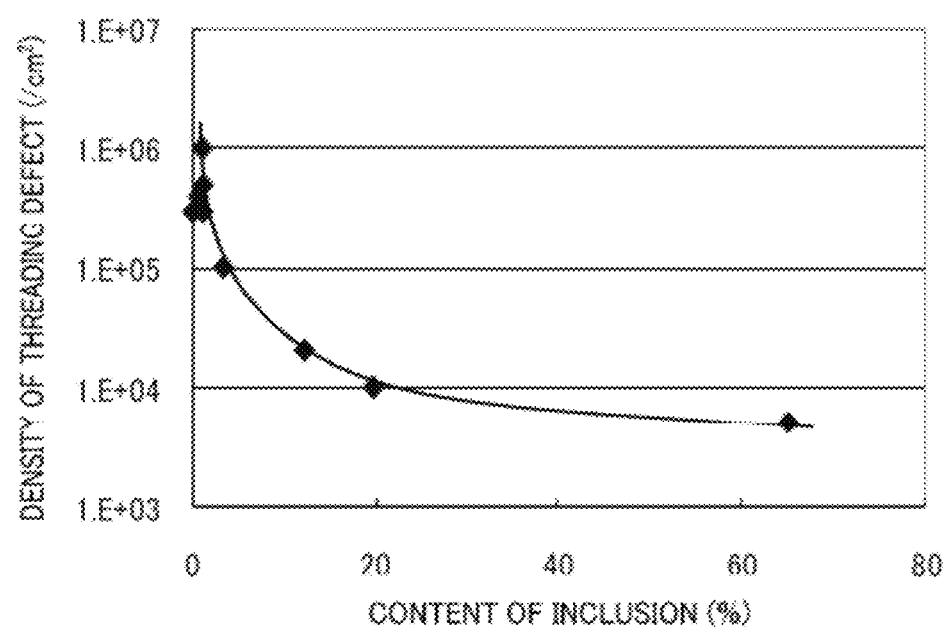
FIG. 2 is a graph representing the relationship between the content of inclusions and the density of threading defects in a crystal.
Figure 3:
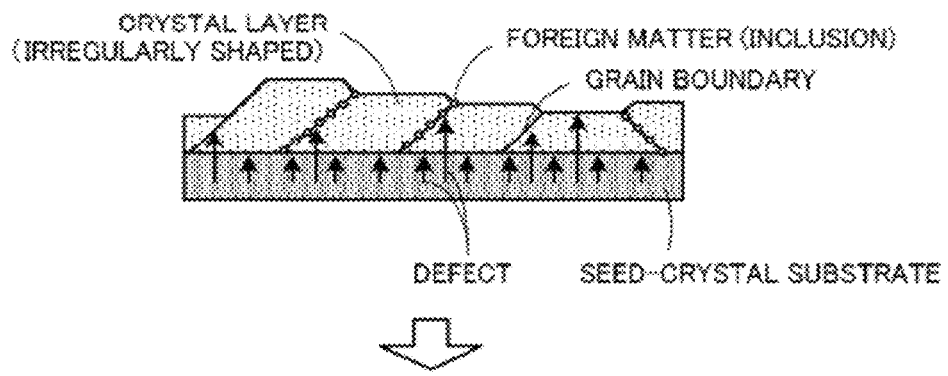
FIG. 3 is an explanatory view illustrating an example of specific procedures of a method for growing a group 13 nitride crystal according to the present invention, the method including surface planarization and cleaning of oxide.
Figure 3:
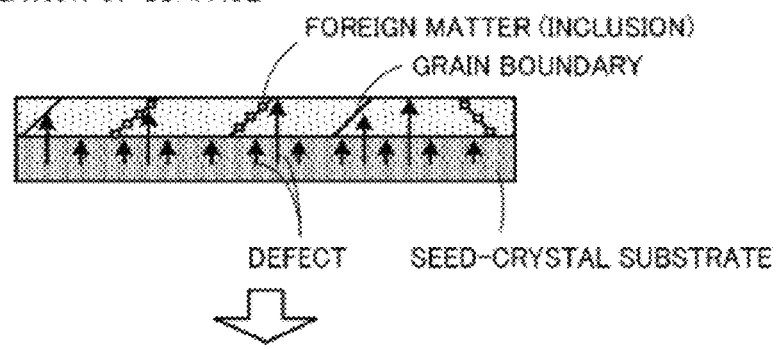
Figure 3:
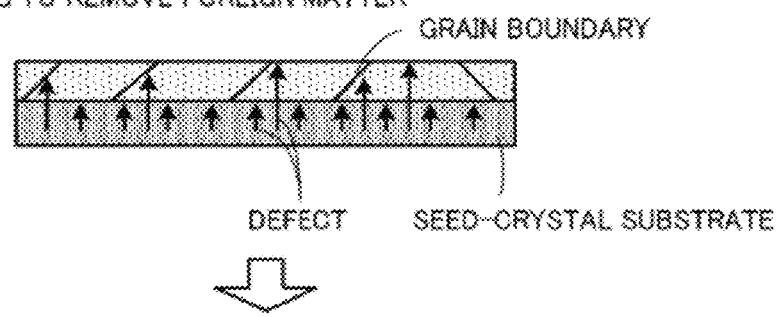
Figure 3:
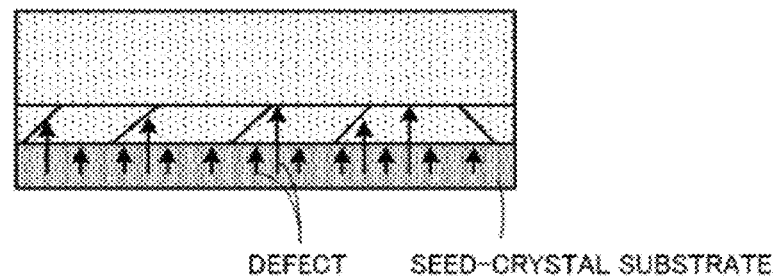
Figure 10:
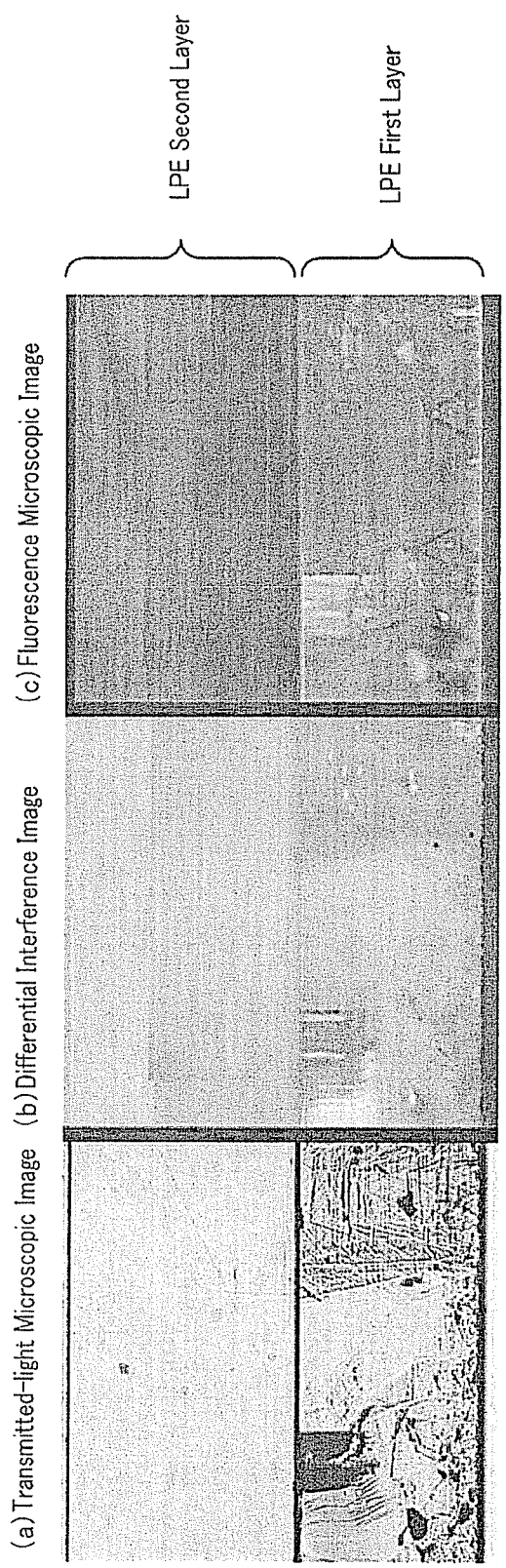
FIG. 10 illustrates photographs of a transmitted-light microscopic image, a differential interference image, and a fluorescence microscopic image of a section of a gallium nitride crystal obtained in Example 5.

A gallium nitride crystal was grown in accordance with the specific procedures in FIG. 2. The first and second stirring conditions were the same as in Example 1. The gallium nitride crystal was grown under the first stirring condition for 60 hours. The outer container 42 was then cooled and the seed-crystal substrate 54 that was overlain by the grown crystal was taken out into the air. The resultant gallium nitride crystal had a diameter of 2 inches and a thickness of about 1.3 mm. The crystal growth rate was about 22 μm/h. Step-shaped irregularities were observed in a wide area of the crystal surface. The surface of the crystal was then made smooth by polishing. The polished crystal had a thickness of 1.0 mm and a surface roughness Ra of 0.4 nm. The crystal was then sequentially subjected to ultrasonic cleaning with acetone, ultrasonic cleaning with alcohol, ultrasonic cleaning with pure water, nitrogen blowing, heating to 1000° C. in a nitrogen atmosphere, cleaning with an aqueous solution of potassium hydroxide, ultrasonic cleaning with pure water, nitrogen blowing, and ashing of the surface with a nitrogen plasma asher. By performing such treatments, organic matter, Na compounds, Ga compounds, remaining carbon, and the like were removed from the crystal surface. The surface oxidized layer and the work affected layer were removed by dry etching. After that, the crystal was put into the outer container 42 and placed again in the crystal substrate production apparatus 10. The gallium nitride crystal was grown under the second stirring condition for 100 hours. The outer container 42 was then cooled and the crystal was taken out. The regrowth portion of the resultant gallium nitride crystal had a thickness of 1.2 mm. The growth rate was 12 μm/h. The crystal surface was smooth. The observation of a section of the resultant gallium nitride crystal was performed as in Example 1. In a region below the polished surface, a large number of grain boundaries containing inclusions were observed, whereas, in a region above the polished surface, inclusions and grain boundaries were not observed. FIG. 10 illustrates a transmitted-light microscopic image (refer to FIG. 10($a$)), a differential interference image (refer to FIG. 10($b$)), and a fluorescence microscopic image (refer to FIG. 10($c$)) of a section of the gallium nitride crystal obtained in Example 5. In FIG. 10, the term "LPE" is an abbreviation of liquid phase epitaxy. The region above the polished surface was separated by processing and subjected to the evaluation of inclusion content by image processing as in Example 1. The inclusion content was found to be 0 to 10%. The evaluation of EPD was performed as in Example 1 and it was found that almost the entire region except for the circumferential portion had an EPD on the order of $10^4/cm^2$ or less.

Reference Examples 1 to 5

GaN substrates produced by a vapor phase epitaxy method were used as seed crystals and the relationship between the surface roughness Ra and the quality of a LPE crystal was studied. Since the GaN substrates used herein had dislocations but scarcely had foreign matter in grain boundaries, these GaN substrates were regarded as being the same as the crystal produced by the growth of a gallium nitride crystal under the first stirring condition in Example 5. In Reference Examples 1 to 5, the GaN substrates were polished by polishing methods described in Table 2 such that the surface roughness Ra was made 0.4 to 7.5 μm; and gallium nitride crystals were then grown under the same condition as the second stirring condition in Example 5. The gallium nitride crystals obtained in Reference Examples were measured in terms of the full-width at half-maxim of XRC. The results are described in Table 2. As is clear from Table 2, the lower the surface roughness Ra, the narrower the width in XRC becomes. Specifically, when the surface roughness Ra was 1.5 μm, a crystal of high quality having a relatively small number of dislocations was obtained; and, when the surface roughness Ra was 0.6 μm and 0.4 μm, crystals of higher quality were obtained. Accordingly, the planarization is preferably performed such that the surface roughness Ra is made 1.5 μm or less. The narrower a full-width at half-maxim of XRC in a crystal, the smaller the number of dislocations is and the higher the quality is. However, the number of dislocations in a gallium nitride crystal grown does not become less than the number of dislocations of the seed crystal.

The present application claims priority from Japanese Patent Application No. 2009-032779 filed on Feb. 16, 2009, the entire contents of which are incorporated herein by reference.

INDUSTRIAL APPLICABILITY

The present invention is applicable to manufacturing high-frequency devices represented by power amplifiers and semiconductor devices such as blue LEDs, white LEDs, and violet semiconductor lasers.

The invention claimed is:
1. A method for growing a group 13 nitride crystal, the method comprising growing a group 13 nitride crystal on a seed-crystal substrate under heating in an oxygen-free pressurized atmosphere containing nitrogen gas while the seed-crystal substrate is immersed in a melt mixture containing a group 13 metal and a flux,
wherein the group 13 nitride crystal is grown under a first stirring condition of stirring the melt mixture, the first stirring condition being set for providing a rough growth surface; and the group 13 nitride crystal is subsequently grown under a second stirring condition of stirring the melt mixture, the second stirring condition being set for providing a smooth growth surface.
2. The method for growing a group 13 nitride crystal according to claim 1,
wherein the second stirring condition is milder than the first stirring condition.
3. The method for growing a group 13 nitride crystal according to claim 1,
wherein the first stirring condition is a condition in which a stirring direction is reversed at intervals of a first predetermined time, and the second stirring condition is a condition in which a stirring direction is reversed at intervals of a second predetermined time that is longer than the first predetermined time; or the first stirring condition is a condition in which rotation is performed in a single direction at a first rotation speed, and the second stirring condition is a condition in which rotation is performed in a single direction at a second rotation speed that is lower than the first rotation speed.
4. The method for growing a group 13 nitride crystal according to claim 1, wherein a cycle defined as an operation of growing the group 13 nitride crystal under the first stirring condition and subsequently growing the group 13 nitride crystal under the second stirring condition, is repeated twice or more.

TABLE 2

|  | Polishing Method | 3 μm Abrasive Grain Diamond Lap | 1 μm Abrasive Grain Diamond Lap | 0.5 μm Abrasive Grain Diamond Lap | 0.13 μm Abrasive Grain Diamond Lap | 0.13 μm Abrasive Grain Diamond Lap + RIE |
|---|---|---|---|---|---|---|
| Seed Crystal | Surface Roughness Ra (μm) | 7.5 | 2.8 | 1.5 | 0.6 | 0.4 |
| LPE Crystal HWHM of XRC | (002) Reflection (sec) | 220 | 206 | 184 | 173 | 129 |
|  | (102) Reflection (sec) | 489 | 324 | 201 | 159 | 127 |
|  | Quality | X | Δ | ○ | ◎ | ◎ |

X: Bad,
Δ: Low,
○: High,
◎: Very High

5. The method for growing a group 13 nitride crystal according to claim 1,
wherein the group 13 nitride crystal is grown under the first stirring condition; the seed-crystal substrate that is overlain by the grown crystal is subsequently taken out from the pressurized atmosphere into the air; a surface of the crystal is planarized so as to have a surface roughness Ra of 1.5 μm or less; the crystal substrate is cleaned to remove oxide of the group 13 metal and/or oxide of the flux; and the seed-crystal substrate is subsequently brought back into the pressurized atmosphere and the group 13 nitride crystal is grown under the second stirring condition.

6. A method for growing a group 13 nitride crystal, the method comprising growing a group 13 nitride crystal on a seed-crystal substrate under heating in a pressurized atmosphere containing nitrogen gas while the seed-crystal substrate is immersed in a melt mixture containing a group 13 metal and a flux,
wherein the group 13 nitride crystal is grown under a first stirring condition of stirring the melt mixture, the first stirring condition being set for providing a rough growth surface; and the group 13 nitride crystal is subsequently grown under a second stirring condition of stirring the melt mixture, the second stirring condition being set for providing a smooth growth surface.

* * * * *